United States Patent
West et al.

(10) Patent No.: US 9,389,281 B2
(45) Date of Patent: Jul. 12, 2016

(54) MAGNETIC COMPENSATION CIRCUIT AND METHOD FOR COMPENSATING THE OUTPUT OF A MAGNETIC SENSOR, RESPONDING TO CHANGES IN A FIRST MAGNETIC FIELD

(71) Applicant: VALE S.A., Centro, Rio de Janeiro (BR)

(72) Inventors: Gordon Fox West, Toronto (CA); Peter Whyte Walker, Mississauga (CA); Benjamin David Polzer, Sudbury (CA)

(73) Assignee: Vale S.A., Rio de Janeiro (BR)

( * ) Notice: Subject to any disclaimer, the term of this patent is extended or adjusted under 35 U.S.C. 154(b) by 531 days.

(21) Appl. No.: 13/868,721

(22) Filed: Apr. 23, 2013

(65) Prior Publication Data

US 2014/0288862 A1    Sep. 25, 2014

Related U.S. Application Data (60) Provisional application No. 61/804,097, filed on Mar. 21, 2013.

(51) Int. Cl.
 *G01R 27/16* (2006.01)
 *G01R 33/00* (2006.01)
 *G01R 33/025* (2006.01)

(52) U.S. Cl.
 CPC ........ *G01R 33/0017* (2013.01); *G01R 33/0029* (2013.01); *G01R 33/025* (2013.01)

(58) Field of Classification Search
 CPC .......................... G01R 33/0017; G01R 33/0041
 USPC ............................... 375/233; 324/253; 702/65
 See application file for complete search history.

(56) References Cited

U.S. PATENT DOCUMENTS

| | | | |
|---|---|---|---|
| 5,465,012 A | 11/1995 | Dunnam | |
| 5,920,130 A | 7/1999 | Paschen et al. | |
| 5,952,734 A | 9/1999 | Gelbien | |
| 6,798,632 B1 | 9/2004 | Holmes et al. | |
| 2003/0058930 A1* | 3/2003 | Sawada ............ | G11B 20/10009 375/233 |
| 2004/0006267 A1 | 1/2004 | Buchanan | |
| 2005/0195551 A1 | 9/2005 | Buschbeck et al. | |
| 2009/0295391 A1 | 12/2009 | Bosnar | |

(Continued)

FOREIGN PATENT DOCUMENTS

| | | |
|---|---|---|
| EP | 2 259 081 A1 | 12/2010 |
| GB | 2 438 057 A | 11/2007 |
| WO | WO 2011/063510 A1 | 6/2011 |
| WO | WO 2011/085462 A1 | 7/2011 |

*Primary Examiner* — Lam Nguyen
(74) *Attorney, Agent, or Firm* — Arent Fox LLP (57) ABSTRACT

A solution for compensating a magnetic field sensor to permit detection of a small magnetic field in the presence of a large magnetic field is disclosed. A magnetic field sensor detects the magnetic field which produces an analog signal then encoded by an analog to digital converter (ADC) into a digital stream. A controller operating on the digital stream incorporates additional sensor data to create a compensation signal which is sent to a digital to analog (DAC) converter. This compensation signal then modifies the output of the magnetic field sensor before entering the ADC. Compensation is software controlled, and is thus adaptable to numerous conditions requiring compensation. Apart from being easily tunable, the compensation may respond dynamically to changing conditions. The invention has particular application to airborne electromagnetic surveying where small fields scattered from the Earth are measured in the presence of a large transmitted field.

16 Claims, 4 Drawing Sheets

(56) References Cited

U.S. PATENT DOCUMENTS

| | | |
|---|---|---|
| 2010/0026280 A1 | 2/2010 | Davydychev et al. |
| 2010/0052685 A1 | 3/2010 | Kuzmin et al. |
| 2011/0144953 A1 | 6/2011 | Kropp et al. |
| 2011/0292977 A1 | 12/2011 | Farjadrad |
| 2014/0184214 A1* | 7/2014 | Schaffer ................ G01R 33/04 324/253 |

* cited by examiner

MAGNETIC COMPENSATION CIRCUIT AND METHOD FOR COMPENSATING THE OUTPUT OF A MAGNETIC SENSOR, RESPONDING TO CHANGES IN A FIRST MAGNETIC FIELD

CROSS REFERENCE TO RELATED APPLICATIONS

This application claims priority to U.S. Patent Application No. 61/804,097, filed Mar. 21, 2013, the contents of which are entirely incorporated herein by reference.

BACKGROUND OF THE INVENTION

1. Field of the Invention

The present invention relates generally to the measurement of magnetic fields, and in particular to the methods and apparatus for accurately detecting the presence of a weak scattered magnetic field in the presence of a known stronger field. In particular, embodiments of the current invention relate to methods for improved geophysical electromagnetic surveying.

2. Description of the Related Art

The removal of the effect of a known but unwanted magnetic field on a sensor is generally known as compensation, and is sometimes referred to as bucking. Compensation can be considered to have two distinct forms. In the first form, sometimes called active bucking, a first magnetic field is cancelled over a volume of space by creating a second magnetic field that is in opposition to it. In the second form of compensation, sometimes called passive bucking, the effect of a magnetic field detected by a sensor is cancelled by adding a voltage to the output of the sensor which is in opposition to the sensor's output.

There can be several reasons for wanting to remove a large magnetic field signal from a magnetic sensor. In particular, by removing a large part of the signal, thereby lowering the signal measured by the sensor, the effective dynamic range of the sensor can be extended, so allowing greater amplification and resolution of the field than would otherwise be possible. Additional reasons may include improved linearity and reduced slew-rate related noise. Furthermore, if compensation causes the magnetic field in the vicinity of the sensor to be reduced, there can be a corresponding reduction in noise caused by eddy current induction and induced magnetization in nearby metallic components.

For the purposes of this invention, a magnetic (H) sensor may be a magnetometer, as exemplified by a SQUID, a feedback coil, a fluxgate, an atomic vapour sensor, or similar device which is directly sensitive to the magnetic field, or a coil, a loop or similar electrical circuit element, which by virtue of Faraday's Law, is sensitive to time variations in magnetic flux density, or any instrument with similar functionality.

Compensation methods have found their way into a number of diverse applications, one of which is to suppress transmitted electromagnetic energy. For example, in document GB 2438057A to Robertson, electromagnetic radiation broadcast by a magnetic sensor is suppressed. In another example, Paschen et al disclose how to suppress transmission line noise in U.S. Pat. No. 5,920,130A. In a third example, Holmes and Scarzello use a set of three orthogonal Helmholtz coils to enclose an electrical device in U.S. Pat. No. 6,798,632 B1, also to suppress emitted power-frequency radiation.

Compensation methods can also be used to control magnetic field noise within a volume, as is common for rooms containing magnetic resonance imaging or electron beam devices. In such cases, currents sent through Helmholtz coils surround a volume to be shielded. Compensation is generally achieved by placing a magnetic sensor within the shielded volume, the signal from which is then used to generate a current in the coils and so annul the field at the sensor. This method is employed in document U.S. Pat. No. 5,465,012A to Dunnam, which uses three sets of orthogonal Helmholtz coils to compensate for a uniform magnetic field inside the coils, as does Kropp et al, in document US 2011/0144953, who consider the case of compensating for gradient fields. Buschbeck et al, in US document 2005/0195551, observe that in some applications involving particle beams, it is difficult to place the sensor in the volume where the field is to be annulled, and so two sensors, placed at two points, are used to interpolate the field value to be cancelled. Gelbien in U.S. Pat. No. 5,952,734 disclose an apparatus for maintaining a constant magnetic flux in a region by employing a coil energized by a servo loop and controlled by a flux lock circuit and a magnetic sensor. A compensation method which employed both coils and a magnetically shielded room was proposed by Buchannan in US document 2004/0006267. Wallauer in EP 2259081A1 proposed a magnetic field compensation method with a magnetoresistive sensor sensing the field within Helmholtz coils. Wallauer's invention split the incoming magnetic field signal into complementary high and low frequency components, with the low frequency component passed through an analogue to digital converter (ADC), a digital filter, then a digital to analogue converter (DAC) before being recombined with the high frequency component and passed to the Helmholtz coils.

Farjadad is US document 2011/0292977 discloses an ethernet based compensation circuit for well log applications in which a common mode signal is input to a controller to generate a compensation signal for application to a differential signal. The purpose of the invention is to pre-compensate the differential signal to reduce the effect or noise interference or imbalance in communication channels.

In the field of geophysical measurement, where the conductivity structure of the Earth is deduced from electromagnetic (EM) field measurements, compensation methods are common. A prevalent example of such compensation is found in active source electromagnetic prospecting systems. In an active EM system, a transmitter energizes a loop or coil with a periodic (steadily repeating) time-varying current. This current creates an electromagnetic field, typically referred to as the "primary" field, which energizes current flow within the Earth. These Earth currents create a "scattered" electromagnetic field which is detected by a receiver attached to the EM system. In many EM systems, the transmitter and the receiver are geometrically configured so that the primary field is orders of magnitude larger than the scattered field. In such cases, it is advantageous to employ compensation methods to remove as much as possible the primary field from the sensors allowing smaller scattered fields to be detected.

In many active source systems, compensation is implemented by achieving a balance between the primary field and a second field created by a bucking coil. In so doing, the net field from the two fields may be approximately annulled at the sensor.

Accurate balancing of the bucking with the primary field is best achieved when the coil geometries are fixed, as this also fixes the mutual inductances between the transmitter and the bucking coils, and their coupling to the volume where the fields are to be annulled. With the geometry of the coils fixed, accurate compensation at a single point may be achieved by placing the bucking coils in a series circuit with the transmitter coils and adjusting the moments of the respective coils so that the magnetic fields are in exact opposition. This approach works best in cases where the fields are not significantly disturbed by other sources of scattering, and where the coil geometry is rigid. It is particularly effective when the transmitter and bucking coils are in series and so have the same current waveforms, at least at frequencies well below those at which the coil capacitance influences the load impedance significantly.

An example of compensation is provided by Davydychev et al, who disclose an apparatus for adjusting the mutual inductance of a transmitter and receiver coil in US document 2010/0026280, with both a bucking coil and a trim coil. The trim coil is included to permit the field of the bucking coil to be adjustable, so improving the quality of the null that can be achieved. Another example is seen in the field of ground geophysical measurement, where Bosnar in US document 2009/0295391 A1 discloses an instrument for simultaneously measuring both the static magnetic field and the time-varying electromagnetic (EM) response of the ground. Bosnar uses a rigid geometry in which a Helmholtz-type compensation coil is used to annul the time-varying primary electromagnetic field at a magnetometer used to detect the Earth's static magnetic field.

For the reasons cited above, compensation is often required in airborne electromagnetic (AEM) measurements in which a controlled source transmitter loop is employed. An example of an AEM system employing compensation is provided in US document 2010/0052685 to Kuzmin and Morrison, which discloses a flexible AEM apparatus, commercialized as the VTEM AEM system. In the VTEM system, concentric transmitter and bucking coils are centred on a receiver. Bucking is also used in the Aerotem AEM system, in which a rigid geometry is employed, with compensation in the latter AEM system tending to be more effective than in the former because a rigid coil geometry used. The more stable bucking system of AeroTem versus VTEM is thus obtained at the cost of extra weight, implying a greater survey expense, and a large framework which is more expensive to ship and to repair if damaged. A means of accurately compensating a system with flexible geometry would be an advantage.

The primary field bucking just discussed permits the electromagnetic receiver to be operated at a larger gain than would otherwise be possible absent compensation, and accordingly permits the scattered fields of the Earth to be measured with greater sensitivity. Even so, compensation systems employed in the current state of the art in AEM methods only compensate the primary field of the transmitter. Yet there are other strong sources of magnetic field variation in various forms of noise which also degrade the quality of measurement and limit the gain of the receiver. These include the effect of magnetic sensor rotation in the static magnetic field of the Earth, radiated energy from power lines and cultural sources, and spheric noise. In cases where an EM system is mounted on a metallic vehicle, such as the GEOTEM AEM system, or where EM measurements are made proximate to a large conductor, such at sea, or in a mine in the presence of conductive and/or permeable ores and infrastructure, compensation that could dynamically respond to the changing conductive environment would be an advantage.

An additional effect which occurs in some AEM systems operating in the time domain occurs because the transmitter current waveform may take a finite time to propagate through the transmitter loop, an effect which may be noticeable at the receiver when the loop is rapidly energized with current. In such cases, the current in a compensation coil mounted in series with the transmitter coil may not be in-phase with the current(s) in the transmitter loop(s), so may require correction.

While bucking coils are intended to increase the quality of AEM survey data, these same coils may act as antennae and so may pickup and retransmit sources of background noise, creating an additional source of noise in AEM data set. Further noise could be caused by the change in coil coupling with respect to the static field of the Earth. Such considerations would not be a factor were the bucking field to oppose exactly the primary field at frequencies low enough that coil capacitances are not a factor. However, in practice exact cancellation is difficult to achieve and there may be a residual, uncancelled signal as a result, particularly in systems which are not rigid. It would therefore be advantageous to have a small, compact bucking system which could respond to such effects.

Furthermore, in an AEM system such as proposed by Polzer in document WO 2011/085462, where the receiver is on a motion-isolated platform, the receiver may translate or rotate with respect to the transmitter, so standard approaches to bucking which annul the primary field at a single point may be ineffective. In such cases, it would be advantageous to separate the compensation system from the transmitter loop and place it with the receiver. It is further advantageous in this case to create a digital bucking signal based on data sent to receiver module wirelessly rather than relying on an analogue series configuration. Such a configuration would be difficult to implement for this system as a direct electrical connection, as the direct connection would interfere with the motion isolation.

SUMMARY OF THE INVENTION

In accordance with the present invention, there is provided a magnetic field compensation system for suppressing the effect of a large magnetic field on a magnetic sensor, or its output, so as to permit small variations of the field to be detected with improved sensitivity, referred to herein as a "compensator". The invention utilizes digital signal processing to predict the compensation to be applied. A magnetic sensor detects a magnetic field as an analogue signal, which is then digitally encoded by an analogue to digital converter (ADC). This signal is read by a controller and time stamped. The controller then transmits these signals to a data processing computer for processing and storage. The processing computer develops a prediction of the future compensation waveform based on a model which includes data received from the controller. The computer passes the predicted waveform back to the controller. The controller generates a digital output compensation signal (amplitude as a function of time) which is sent to a digital to analogue converter (DAC) where it is converted to analogue form. The output analogue signal from the DAC generates the compensation signal which suppresses the effect of the large magnetic field, either on the magnetic sensor directly or on its output.

In some embodiments, additional sensor inputs may be used to assist in predicting the compensation signal. In these embodiments, the controller time stamps the incoming sensor data transmits them to a data processing computer for processing and storage. These additional (or auxiliary) sensor inputs are used by the data processing computer together with the aforementioned inputs to develop the predicted waveform. In cases in which the primary magnetic field created by the transmitter of an electromagnetic prospecting system is to be compensated, auxiliary sensor data may refer to the transmitter's current waveform shape and amplitude, and to the geometrical configuration of the transmitter loop.

In one embodiment of the current invention, the compensation signal is added to the analogue output of the sensor to suppress the analogue signal of the large unwanted magnetic field before it is digitized, thereby improving the sensitivity of the DAC.

In a second embodiment, the compensation current drives current in a coil which is then used to suppress the large unwanted magnetic field variation on the sensor, so permitting the smaller field to be detected.

In either embodiment, signal inputs to the controller may comprise data streams emanating from auxiliary sensors from which the compensation for the larger magnetic field may be predicted. Sensors may include a transmitter waveform monitor, coil and sensor geometry and displacement monitors, a camera, a magnetometer, an induction coil, an angular rate sensor, an accelerometer, a tiltmeter and a GPS or other geolocation instrumentation means. These sensor data, as well as the data stream of the compensated magnetic sensor itself, may form the input data upon which predictive modelling or filtering may be used to compute and so suppress the effect of a large magnetic field. Compensation may be applied to the primary field of an electromagnetic transmitter, but it may also be applied to such other effects as power line magnetic fields. A key feature of the invention is that it may use a predictive software model with inputs from sensors to adaptively compensate the magnetic field measurement as conditions warrant.

The present invention may be deployed as the receiver of an electromagnetic prospecting system by mounting it in a suitable housing together with a power supply and optionally with auxiliary sensors so as to provide geolocation, orientation and other data as may be required. Where a transmitter is not present, the present invention may thus be employed as a passive electromagnetic receiver in which power line noise or the effect of rotational motion may be compensated. Where a transmitter is present, the present invention may further compensate for the primary field of the transmitter. This may be done either by passively monitoring the current waveform output by the transmitter, or by monitoring the transmitter waveform while actively sending waveform control information to the transmitter.

The invention has several aspects which represent improvements over the current state of the art. In geophysical prospecting, the invention is applicable to active EM methods where primary field compensation is often of paramount concern, and to passive EM methods, where compensated data may be acquired on moving platforms or in the presence of power line noise.

With regard to geophysical prospecting applications the present invention has the advantage of being largely independent of system hardware. By providing suitable sensor inputs with a predictive model, for example, the invention may be applied to airborne electromagnetic (AEM) systems having a flexible geometry. The predictive model may be a neural network trained or otherwise fashioned while the AEM system is removed from the scattering effect of the Earth. The predictive capability may also be employed to provide for compensation which accounts for the positions of aircraft control surfaces. The predictive element is also important when compensating for a periodic primary waveform, as computer processing latencies in the application of the compensation signal may be accommodated with delays of one or more periods of the primary waveform. A predictive model may include inertial, dynamic and kinematic sensor inputs so as to predict the signal caused by the rotation of a sensor in the static magnetic field of the Earth.

Another advantage of the invention is that the compensation may be done on a platform which is mechanically independent of the transmitting antenna, permitting compensation on platforms designed for motion isolation, an example of which is provided by Polzer et al in patent WO 2011/085462. By linking the compensated sensor digitally with the controller, the sensor may be placed away from the controller, peripheral devices, and any noise they may make. In so doing, the space and power requirements of the compensated sensor are also minimized. Finally, compensation can be provided at very low power levels such as may be provided by battery systems, permitting use on platforms where large amounts of power are not available.

An additional aspect of the invention is that the dynamic range of the measurement system is extended by taking advantage of the intrinsically higher fidelity of DACs as compared to ADCs by subtracting an analogue waveform created from the predictive model of the magnetic field. In the case where the signal to be compensated is periodic, the compensation signal may be predicted with a controlled latency so that the compensation signal may be fed back precisely one cycle, or a number of cycles, delayed. The compensation signal as well as the compensated signal are recorded and time stamped together with the peripheral sensor data upon which the compensation signal is modeled. The uncompensated signal may then be computed from these records.

DESCRIPTION OF PREFERRED EMBODIMENTS OF THE CURRENT INVENTION

Figure 1:
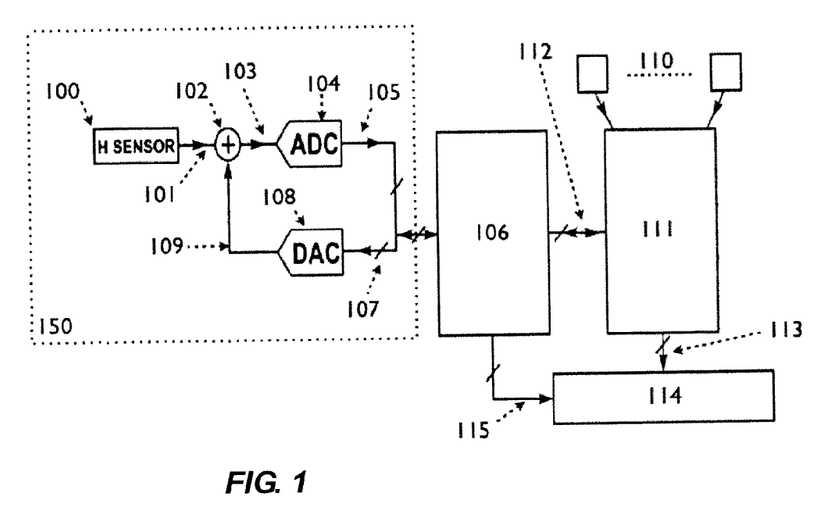
FIG. 1 shows one embodiment of the invention implemented for a single magnetic sensor. Lines marked with a slash denote conduits for digital data; arrows indicate the direction of signal propagation.

One preferred embodiment of the current invention, illustrated in FIG. 1, provides for compensation by means of adding analogue signals. FIG. 1 illustrates magnetic sensor 100 which creates a signal output on analogue line 101 to one of the inputs of the adder 102. Adder 102 creates a signal which is sent on analogue line 103 where it is then converted to digital form by an Analogue to Digital Converter (ADC) 104. The digital signal is output on digital link 105 to a controller 106. Controller 106 uses input digital signals on digital links 105 and 112 to compute and send an output digital compensation signal on digital link 107 to Digital to Analogue Converter (DAC) 108 where it is converted to analogue form. The digital signals on links 105 and 107 are also saved to storage device 114 via link 115 along with the precise time, allowing the uncompensated field to be mathematically reconstructed. The analogue signal from DAC 108 is output on line 109 to become the second input to adder 102. Controller 106 also outputs the digital signal received on link 105 to a computer 111 via link 112.

Where additional data are required to form a compensation signal, auxiliary analogue or digital sensors 110 transmit data to computer 111 for storage and use in computing the compensation signal. Computer 111 also updates the model predicting the magnetic field on sensor 100 using inputs from the controller 106 and the sensors 110.

Said computer 111 is adapted to produce a computational (or digital) model of the magnetic field using an algorithm that substantially predicts the expected value of magnetic field based on the first digital signal, the prior digital compensation signal and any required auxiliary sensor data, permitting compensation for the following effects commonly experienced in EM measurements, including but not limited to:

large, repetitive magnetic field of a transmitter loop,
the finite speed of light in a transmitter loop,
the rotation of the magnetic sensor in the Earth's magnetic field,
the change in mutual inductance of the transmitter and receiver circuit,
variations in harmonic noise, for example due to power lines and electrical machinery,
the large response of the Earth when an EM survey system is energized on or near the ground,
the response of seawater,
the background response of an EM system mounted on a carrier containing metallic components, such as an aircraft, whereby the background response is measured while the system is removed from the Earth,
the response of metallic machinery or metal parts,
the static magnetic field of the Earth,
or any combinations of the above.

The resulting digital data is transmitted on digital link 112 to controller 106, and to data storage unit 114 via link 113.

The magnetic sensor 100, adder 102, ADC 104 and DAC 108 constitute sensor package 150.

The digital links 105, 107, 112, 113 and 115 may comprise a direct electrical connection, an optical connection, an infrared connection, a wireless connection or combinations thereof.

In other embodiments of the current invention, additional magnetic sensors 100 may be added to the controller 106 as required, and an embodiment of the current invention may include two, three or more magnetic sensors 100 so configured in their respective sensor packages 150.

Figure 2:
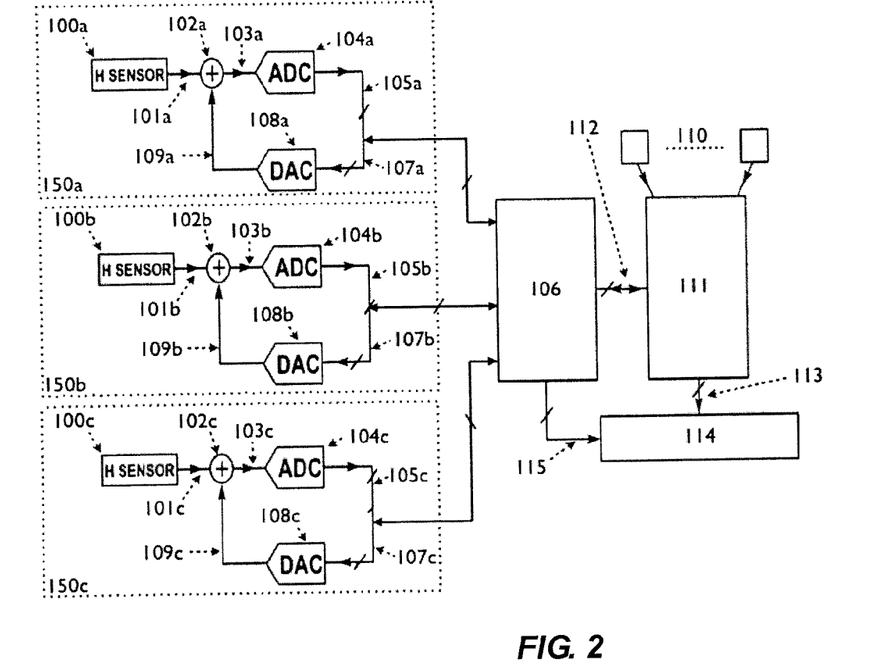
FIG. 2 shows an embodiment of the invention configured to receive data from three magnetic sensors.

FIG. 2 shows the controller 106 configured to receive data from three magnetic sensors 100*a*, 100*b*, 100*c* using three embodiments of sensor package 150*a*, 150*b* and 150*c*. The sensor packages 150*a*, 150*b* and 150*c* in FIG. 2 may be configured to permit acquisition of three-component electromagnetic data.

In the current state-of-the-art, the precision obtainable from a DAC is approximately an order of magnitude more precise than is available from an ADC. Thus, the compensating signal provided by the DAC 108 is known to significantly higher accuracy in comparison with the signal that may be read from an ADC 104. Consequently, the analogue signals on lines 101 and 109 may be approximately an order of magnitude larger than the output analogue signal on line 103 without a loss of resolution at ADC 104.

Provision of digital links, such as 105, 107, 112, and 115 permit the controller 106, the computer 111, or both, to be located either remotely, or on separate platforms from sensor 100. These features are advantageous as they remove the sensor from noise associated with computing equipment and permit the sensor package 150 to be compact and lightweight. In such cases, the sensor package 150 may be physically separated from the other components of the present invention by employing wireless means of data transfer. This feature is particularly advantageous where space and weight may be at a premium in the vicinity of the sensor.

Accordingly, the invention may be applied in borehole Electromagnetic (EM) methods, where the sensor 100 may be placed at the drill bit where space is at a premium, in airborne methods where the sensor may be mounted either on a drone or on a motion-isolating platform such that weight may be at a premium, or on rotating machinery, in hazardous, explosive or high pressure environments where the sensor package must be enclosed and mounted apart from the computer 111 and controller 106 for mechanical, safety or logistical reasons. In such cases, where a small sensor package 150 must be used, compensation may be provided via digital link to communicate remotely with the controller 106 and any peripherals.

Where strong primary fields may cause spurious signals due to induction in nearby metallic components or ground loops, compensation via digital link has the advantage of removing the sensor 100 from these possible sources of noise, or from noise induced in or generated from the operation of the computing equipment itself.

Figure 3:
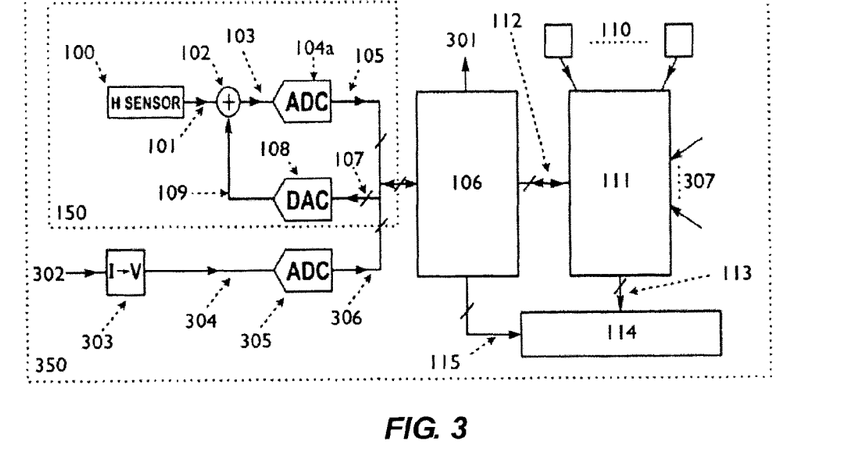
FIG. 3 shows how the invention may be configured to compensate for the primary field of a controlled source EM waveform.
Figure 4:
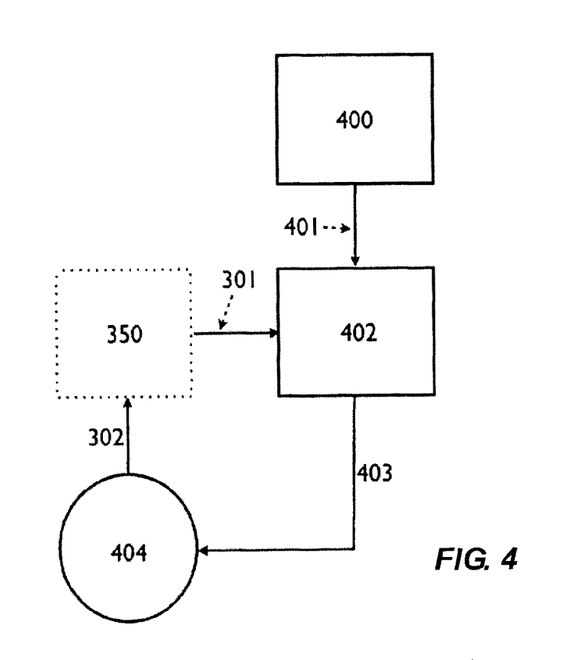
FIG. 4 shows how the invention may be implemented in an EM system.

FIGS. 3 and 4 illustrate aspects of an embodiment of the invention for the case where it is used to compensate the primary field in an active EM system. FIG. 3 illustrates a compensated EM receiver 350, comprising the compensator. FIG. 4 illustrates aspects of an embodiment of the invention in relation to a typical active source EM system. In the embodiment illustrated in FIGS. 3 and 4, the transmitter and the compensator are synchronized, but synchronization of the two is not strictly necessary.

The EM system illustrated in FIG. 4 comprises an energizing current supply 400 which sends a current on cable 401 to energize the transmitter 402. In one embodiment of the present invention, the transmitter accepts control signals on line 301 from the compensated EM receiver 350. The transmitter 402 issues a current on cable 403 to transmitter loop 404. Current circulating in loop 404 creates a primary magnetic field detected in magnetic sensors 100. The transmitter current is measured and transmitted on input line 302 to the compensated EM receiver 350. In certain embodiments of the present invention where the transmitter is not synchronized to the compensator, either or both of lines 301 and 302 may not be necessary.

Referring to the aforementioned embodiment in which the transmitter and the compensator are synchronized, waveform timing control information may be sent to the transmitter 402 (FIG. 4) via output line 301 (FIG. 3) from controller 106, which forms a part of the compensated EM receiver 350. The resulting current waveform is sent to transmitter loop 404 where it is measured on input 302 by current-to-voltage converter 303. The resulting output analogue signal emitted on output line 304 is then digitized by ADC 305. The resulting digitized signal is issued on digital link 306 for processing by the controller 106.

In this embodiment, the current waveform may be averaged over several cycles to create an exemplary waveform which may be used to control the compensation output of the controller 106. Accordingly, the compensation signal for the primary field may be predicted with a controlled latency so that for periodic signals the compensation signal may be fed back precisely one cycle delayed. The exemplary waveform may be used together with auxiliary sensor data, such as may be provided by means of camera images or laser reflectometry, to provide a compensation signal adjusted for changes in geometry of the EM system.

It is to be understood that aspects of the invention in which the current waveform is sent to the compensator may be configured differently from that described above. For example, the information path carrying the current waveform measurement to the computer through the sequence of inputs 302, 304, 306 to 112 could easily be substituted for inputs 110. There are numerous ways the invention could be configured to handle and process the digital inputs; the figures are meant to be illustrative of some of the myriad possibilities for configuring the invention and are not meant to limit the scope of the claims. For example, in another embodiment of the present invention, the transmitter may send waveform timing information directly to the compensated EM receiver.

It is not absolutely necessary for the transmitter and the compensated EM receiver to be synchronized. In another embodiment of the invention, absent signal line 301, the computer passively monitors the transmitter waveform incoming from signal line 302 through to line 112. Rather than using control line 301 to synchronize the period and phase of the current waveform with the compensator, the incoming waveform may be analyzed in the computer over a moving window of time to establish the period and phase of a predicted waveform. The resulting predicted waveform may then be communicated to the controller 106 which injects the compensation signal at the computed synchronized time. Such an embodiment would be preferable as a "button-on" accessory to an existing EM system since it would enable compensation without any modifications to the transmitter.

In a related embodiment, neither of the lines 301 or 302 are present. Rather, the uncompensated signal may be analyzed over a moving window of time to establish its period and phase and so derive an instantaneous predicted waveform, for example using a weighted time average. The resulting predicted waveform may then be communicated to the controller 106 which injects the compensation signal at the computed synchronized time.

In addition to the auxiliary sensor inputs, provision is made for acquiring geolocation data, such as may be acquired by GPS, Glonas, laser, barometric, sonar and radar altimetry, or other instrumentation with similar purpose. Geolocation data are input to computer 111 on data link 307, and are then merged with the data stream to be output on digital link 113.

A GPS or similar independent timing signal may be used to provide synchronized timing information to the transmitter and the compensator from an external source. In such an embodiment, synchronization of the transmitter and the compensator may be possible without signal line 301.

Figure 5:
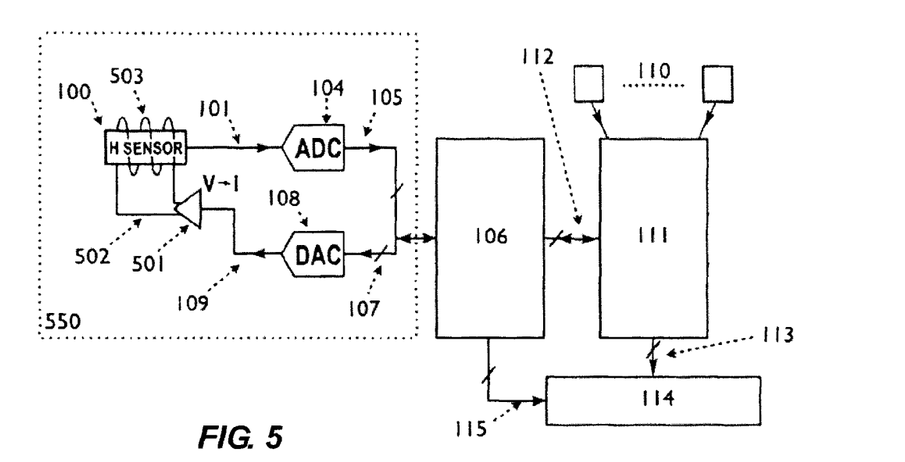
FIG. 5 illustrates another embodiment of the invention illustrated in FIG. 1.

In another embodiment of the current invention, illustrated in FIG. 5, magnetic field feedback is used to compensate for primary magnetic fields in place of voltage feedback. In this embodiment, sensor package 550 replaces sensor package 150, wherein a feedback coil 503 on magnetic sensor 100 replaces the function of the voltage feedback provided by adder 102. Rather than using voltage feedback into the adder, magnetic sensor 100 creates a signal on analogue line 101 which is then converted to digital form by ADC 104. The digital signal is output on digital link 105 to controller 106. Controller 106 uses input digital signals from digital links 105 and 112 to send an output digital compensation signal through digital link 107 to DAC 108, where it is converted to analogue form. The analogue signal from DAC 108 on line 109 is then converted to a current with voltage-to-current converter 501. The resulting current circulates in circuit 502, which comprises feedback coil 503. The current in feedback coil 503 compensates for the magnetic field in sensor 100 in accordance with the digital signal issued by controller 106 to digital link 107.

The aforementioned embodiments of the invention may be implemented as part of an electromagnetic prospecting system. They may be used to compensate for the rotation of a magnetic sensor in a static magnetic field, such as the magnetic field of the Earth. Thus, the compensation model for the magnetic field may include the effect of the primary field and the effect of sensor rotation, as well as any other magnetic field effects which may be necessary. In compensating for the rotation of a sensor, auxiliary inputs may comprise an estimate of the total magnetic field, such as may be provided by a fluxgate magnetometer or alternately, an estimate of the magnetic field from the International Geomagnetic Reference Field (IGRF), and either the orientation of the sensor, such as may be provided for by a gyro, attitude heading and reference system (AHRS) or instrument of similar functionality, or an angular rotation rate sensor, such as may be provided for by pairing accelerometers. The mathematical theory for calculating the signal measured by a magnetic sensor rotating in the magnetic field of the Earth is known in the current state-of-the-art, an example of which is provided in WO 2011/063510 A1 to Kuzmin and Dodds.

Figure 6:
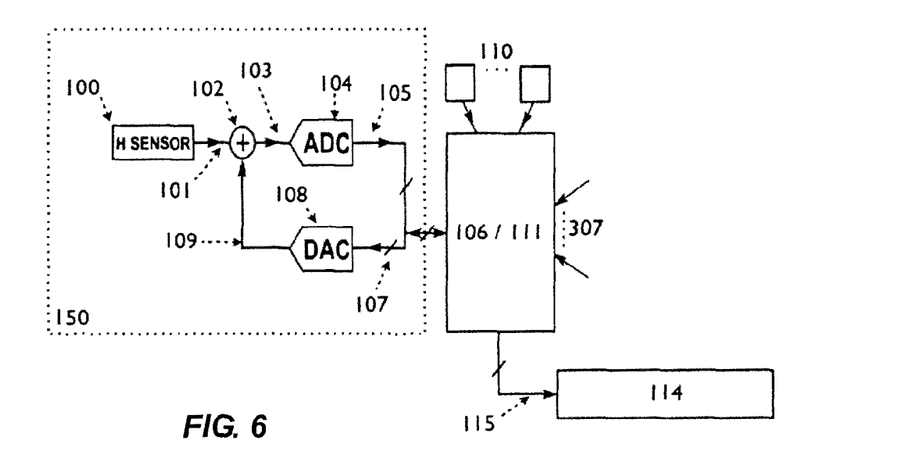
FIG. 6 illustrates another embodiment of the invention illustrated in FIG. 1.

Another embodiment of the invention is illustrated in FIG. 6. In this embodiment, the functions of controller 106 and computer 111 of FIG. 1 are merged together to become the single computer-controller 106/111. In so doing, digital links 112 and 113 become superfluous, sensor inputs 110 and 307 interface directly with the computer-controller 106/111, and digital link 115 acquires the additional function of digital link 113.

In another embodiment of the invention, the compensation may include power line fields as well as for the transmitter current waveform. In yet another embodiment of the present invention, inputs may be from sensors detecting the motion of moving machinery or metallic parts, so as to provide effective compensation for the magnetic fields due to moving ferromagnetic and electrically conducting parts, such as may be encountered in industrial environments or on an aircraft.

While the invention has been shown and described in terms of exemplary embodiments, it will be understood that this invention is not limited to these particular embodiments, and that many changes and modifications may be made without departing from the true spirit and scope of the invention as defined in the appended claims.

What is claimed is:

1. A feedback magnetic compensation circuit, comprising at least one sensor package which outputs a first digital signal, and a controller that receives said first digital signal, computes a digital compensation signal, and then sends said digital compensation signal to said at least one sensor package, wherein said at least one sensor package comprises:

a magnetic sensor which senses a sum of a first magnetic field and a compensating magnetic field created by a feedback coil to create a first analogue signal;

a feedback coil through which a compensation current flows to form said compensating magnetic field over a volume occupied by said magnetic sensor;

an analog-to-digital converter (ADC) which converts said first analogue signal to said first digital signal;

a digital-to-analog converter (DAC) which converts said digital compensation signal to a second analogue signal; and a voltage to current converter which receives said second analogue signal and energizes said feedback coil with said compensation current to create said compensating magnetic field.

2. A magnetic compensator comprising:
a feedback magnetic compensation circuit comprising:
at least one sensor package that outputs a first digital signal, and
a controller that receives said first digital signal, computes a digital compensation signal, and then sends said digital compensation signal to said at least one sensor package; and
a computer which forms a digitally predicted model of the magnetic field,
wherein, for said feedback magnetic compensation circuit, said at least one sensor package comprises:
a second magnetic sensor that senses a sum of a second magnetic field and a compensating magnetic field created by a feedback coil to create a fourth analogue signal;
a feedback coil through which a compensation current flows to form said compensating magnetic field over the volume occupied by said magnetic sensor;
a second analog-to-digital converter (ADC) that converts said fourth analogue signal to said first digital signal;
a second digital-to-analog converter (DAC) which converts said digital compensation signal to a fifth analogue signal;
a voltage to current converter which receives said fifth analogue signal and energizes said feedback coil with said compensation current to create said compensating magnetic field.

3. The magnetic compensator of claim 2, wherein the controller in said feedback magnetic compensation circuit imports said first digital signal and said digitally predicted model of the magnetic field, and outputs said digital compensation signal to said compensation circuit.

4. The magnetic compensator of claim 2, further comprising:
a storage medium that retains said first digital signal, said digital compensation signal, and auxiliary sensor input data.

5. The magnetic compensator of claim 2, wherein said digitally predicted model of the magnetic field is computed in real time.

6. The magnetic compensator of claim 2, wherein said digitally predicted model of the magnetic field is computed from inputs to said computer selected from the group of:
a first digital signal output by said feedback magnetic compensation circuit,
a digital compensation signal output by the controller in said feedback magnetic compensation circuit,
AHRS device outputs,
global positioning device outputs,
accelerometer outputs,
tilt meter outputs,
angular rate transducer outputs,
current monitor outputs,
static field magnetometer outputs,
timer outputs, and
combinations thereof.

7. An active electromagnetic prospecting system compensator comprising the magnetic compensator of claim 2, wherein a current waveform of a transmitter in the electromagnetic prospecting system is measured by a current-to-voltage converter to produce an output analogue signal, said output analogue signal being digitized by the first or the second ADC for input to the controller of said magnetic compensator.

8. The active electromagnetic system compensator of claim 7, wherein the said magnetic compensator compensates for the primary magnetic field of said transmitter.

9. The active electromagnetic system compensator of claim 7, wherein the controller in said magnetic compensator sends waveform information to said transmitter.

10. A compensated EM receiver comprising the magnetic compensator of claim 2, wherein said magnetic compensator is mounted in a transportable housing with a power supply.

11. The compensated EM receiver of claim 10, wherein the current waveform of the transmitter in an electromagnetic prospecting system is measured by a current-to-voltage converter to produce an output analogue signal, said analogue signal being digitized by the first or the second ADC for input to the controller of said magnetic compensator.

12. A method for compensating the output of a magnetic sensor, responding to changes in a first magnetic field, comprising the steps of:
A) creating a first analogue signal, which is formed by sensing a component of the superpositions of a first magnetic field and a compensating magnetic field of a feedback coil;
B) converting said first analogue signal into a first digital signal;
C) inputting said first digital signal in a controller via digital link;
D) computing an output digital signal with said controller, sending said output digital compensation signal via digital link;
E) converting said output digital compensation signal into a second analogue signal by a DAC, outputting a second analogue signal;
F) converting said second analogue signal into a compensation current by a voltage to current converter; and
G) sending said compensation current into said feedback coil so as to create said compensating magnetic field which opposes said first magnetic field where it is measured in step A.

13. The method of claim 12, wherein the transmission of digital signals occurs via methods selected from the group of:
a direct electrical connection,
an optical connection,
an infrared connection,
a wireless connection and
combinations thereof.

14. The method of claim 12, wherein in step D a computer converts said first digital signal and any auxiliary sensor input data into a digitally predicted model of the magnetic field.

15. The method of claim 14, wherein the controller imports said first digital signal, said digitally predicted model of the magnetic field, and outputs said output digital compensation signal.

16. The method of claim 14, wherein said first digital signal is stored after step D in a storage medium which retains said first digital signal, said output digital compensation signal and said auxiliary sensor input data.

* * * * *